United States Patent
Kim et al.

(10) Patent No.: US 7,541,269 B2
(45) Date of Patent: Jun. 2, 2009

(54) METHOD OF FORMING TUNGSTEN POLYMETAL GATE HAVING LOW RESISTANCE

(75) Inventors: Soo Hyun Kim, Seoul (KR); Noh Jung Kwak, Seongnam-si (KR); Baek Mann Kim, Yongin-si (KR); Young Jin Lee, Yongin-si (KR); Sun Woo Hwang, Icheon-si (KR); Kwan Yong Lim, Icheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 61 days.

(21) Appl. No.: 11/693,137

(22) Filed: Mar. 29, 2007

(65) Prior Publication Data

US 2008/0081452 A1    Apr. 3, 2008

(30) Foreign Application Priority Data

Sep. 29, 2006   (KR) ................ 10-2006-0096550

(51) Int. Cl.
*H01L 21/4763* (2006.01)
(52) U.S. Cl. ................ 438/592; 438/585; 438/653; 257/E21.198
(58) Field of Classification Search ........... 438/592, 438/585, 653, 654; 439/197
See application file for complete search history.

(56) References Cited

U.S. PATENT DOCUMENTS

| | | | |
|---|---|---|---|
| 6,861,356 B2 * | 3/2005 | Matsuse et al. | 438/653 |
| 6,943,416 B2 * | 9/2005 | Hu | 257/412 |
| 2004/0113213 A1 * | 6/2004 | Maekawa | 257/411 |
| 2006/0009034 A1 * | 1/2006 | Lai et al. | 438/680 |

FOREIGN PATENT DOCUMENTS

| | | |
|---|---|---|
| JP | 11-068095 A | 3/1999 |
| KR | 1019980055062 A | 9/1998 |
| KR | 1020040059931 A | 7/2004 |
| KR | 1020060058583 A | 5/2006 |
| KR | 2006-0060215 A | 6/2006 |
| KR | 100744108 B1 | 7/2007 |
| KR | 1020000041369 A | 7/2007 |
| TW | 434708 B | 5/2001 |

\* cited by examiner

*Primary Examiner*—Michael Trinh
(74) *Attorney, Agent, or Firm*—Ladas & Parry LLP

(57) ABSTRACT

A tungsten polymetal gate is made by forming a gate insulation layer and a polysilicon layer on a semiconductor substrate; depositing a barrier layer on the polysilicon layer; depositing a tungsten nucleation layer on the barrier layer through an ALD process; depositing a tungsten layer on the tungsten nucleation layer through a CVD process; depositing a hard mask layer on the tungsten layer; and etching the hard mask layer, the tungsten layer, the tungsten nucleation layer, the barrier layer, the polysilicon layer, and the gate insulation layer.

21 Claims, 5 Drawing Sheets

METHOD OF FORMING TUNGSTEN POLYMETAL GATE HAVING LOW RESISTANCE

CROSS-REFERENCE TO RELATED APPLICATIONS

The present application claims priority to Korean patent application number 10-2006-0096550 filed on Sep. 29, 2006, which is incorporated herein by reference in its entirety.

BACKGROUND OF THE INVENTION

The present invention relates to a method of forming a gate in a semiconductor device, and more particularly to a method of forming a tungsten polymetal gate having low resistance.

In a CMOS device, an n+ polysilicon gate could be formed in both the NMOS device and the PMOS device, by which the NMOS device would have a surface channel but the PMOS device would have a buried channel due to counter doping. The buried channel, however, contributes to the increasing short channel effect.

A dual gate forming method proposes to solve this problem by forming an n+ polysilicon gate in the NMOS device and a p+ polysilicon gate in the PMOS device. The short channel effect due to a buried channel is then no longer present as surface channels are formed in both the NMOS device and PMOS device.

However, a dual gate structure also has problems. First is the threshold voltage shift phenomenon due to leakage of boron into a channel region. Second is the gate depletion phenomenon due to out-diffusion of a p-type impurity such as boron from the p-+ polysilicon layer of the PMOS device causing insufficient impurity doping concentration in the polysilicon layer.

As to the threshold voltage shift phenomenon due to the leakage of boron into the channel region, the technique of nitridation treatment to the surface of a gate insulation layer was proposed, but there has been no suggestion for a technique directed to preventing the gate depletion phenomenon due to out-diffusion of boron.

On the other hand, the problems associated with resistance capacitance delay (RC delay) in a word line have become a serious issue that needs to be addressed as the MOSFET design rule is reduced to a sub-100 nm level. As one way to deal with the word line RC delay problems, attempts were made to apply low specific resistance materials as the gate material.

In particular, the choice of a gate material/structure is changing from a polycide gate structure having a stack of a polysilicon (Si) layer and a metal silicide layer to a polymetal gate structure having a stack of a polysilicon layer and a metal layer. For this polymetal gate structure, ways to apply tungsten (W) as the material for the metal layer of the polymetal gate (i.e., a tungsten polymetal gate) are studied.

In a tungsten polymetal gate, the polysilicon layer and the tungsten layer are brought into direct contact. This will then lead to formation of a tungsten silicide layer between the polysilicon layer and the tungsten layer in an annealing process, which causes the volume to expand and thereby induces stress. To prevent this undesirable effect, formation of a diffusion barrier between the polysilicon layer and the tungsten layer is considered essential.

Thus, a tungsten nitride (WN) layer as a diffusion barrier is formed on the polysilicon layer of the tungsten polymetal gate, and then a tungsten layer is deposited on the WN Layer.

In this case, interfacial reaction between the WN layer and the polysilicon layer at a temperature greater than 600° C. leads to the formation of an insulation layer of SiNx, introducing instability into the structure of the tungsten polymetal gate. Moreover, the resistance of the tungsten polymetal gate increases as the interfacial resistance increases due to the interfacial reaction.

More specifically, WN reacts with Si and forms W and $Si_3N_4$. W then reacts with Si forming $WSi_2$. These interfacial reactions lead to formation of the SiNx insulation layer increasing the resistance of the tungsten polymetal gate.

To prevent the interfacial reaction, some suggestions were made to form a WSix layer or a Ti layer or a Ti/TiN layer between the tungsten nitride layer and the polysilicon layer.

Nevertheless, low resistance of the tungsten polymetal gate may be obtainable through formation of a WSix layer between the tungsten nitride layer and the polysilicon layer, but there are other problems due to the high interfacial contact resistance between polysilicon and tungsten intride in the PMOS gate causing the ring oscillator delay phenomenon.

In the case of forming a Ti layer or a Ti/TiN layer between the tungsten nitride layer and the polysilicon layer, the problems related to the high interfacial contact resistance between polysilicon and tungsten nitride in either the PMOS or the NMOS gate may not occur; however, the tungsten polymetal gate cannot achieve low resistance since the grain size of the tungsten layer deposited on the tungsten nitride layer is decreased (as shown in FIG. 1) due to crystallization of the tungsten nitride layer deposited on the Ti layer or the Ti/TiN layer.

SUMMARY OF THE INVENTION

An embodiment of the present invention is directed to a method of forming a tungsten polymetal gate having low resistance.

According to an embodiment of the present invention, a method of forming a tungsten polymetal gate comprises the steps of sequentially forming a gate insulation layer and a polysilicon layer on a semiconductor substrate; depositing a barrier layer on the polysilicon layer; depositing a tungsten nucleation layer on the barrier layer through an atomic layer deposition (ALD) process; depositing a tungsten layer on the tungsten nucleation layer through a chemical vapor deposition (CVD) process; depositing a hard mask layer on the tungsten layer; and etching the hard mask layer, the tungsten layer, the tungsten nucleation layer, the barrier layer, the polysilicon layer, and the gate insulation layer.

The barrier layer comprises a stack of a Ti layer and a WN layer, or a stack of a Ti layer, a TiN layer and a WN layer.

Each of the Ti layer, the WN layer, and the TiN layer has a thickness of 20~150 Å.

After the step of depositing a barrier layer and before the step of depositing a tungsten nucleation layer on the barrier layer, the method further comprises the step of supplying $B_2H_6$ gas for 1~10 seconds to the resultant substrate having the barrier layer formed thereon to facilitate the nucleation reaction.

After the step of depositing a barrier layer and before the step of depositing a tungsten nucleation layer on the barrier layer, the method further comprises the step of supplying $B_2H_6$ gas and $WF_6$ gas to the resultant substrate having the barrier layer formed thereon to facilitate the nucleation reaction.

The step of supplying $B_2H_6$ gas and $WF_6$ gas is implemented in a manner such that $B_2H_6$ gas is supplied for 1~10 seconds, then purged for 0.5~10 seconds, $WF_6$ gas is supplied for 1~10 seconds, and then purged for 0.5~10 seconds, sequentially.

The step of depositing a tungsten nucleation layer comprises the steps of forming a first tungsten nucleation layer on the barrier layer; and forming a second tungsten nucleation layer on the first tungsten nucleation layer.

Each of the first and second tungsten nucleation layers is formed to have a thickness of 10~100 Å.

The first and second tungsten nucleation layers are formed at a temperature of 250~400° C.

The first tungsten nucleation layer is deposited through an ALD process, which uses $SiH_4$ gas or $Si_2H_6$ gas as the reaction gas and gas containing W as the source gas.

The $SiH_4$ gas or $Si_2H_6$ gas is used in its gaseous state or by forming plasma.

The gas containing W is one selected from the group consisting of $WF_6$ gas, $WCl_6$ gas, $WBr_6$ gas, $W(Co)_6$ gas, $W(C_2H_6)_6$ gas, $W(PF_3)_6$ gas, $W(allyl)_4$ gas, $(C_2H_5)WH_2$ gas, $[CH_3(C_5H_4)]_2WH_2$ gas, $(C_2H_5)W(CO)_3(CH_3)$ gas, W(butadiene)$_3$ gas, W(methylvinyl-ketone)$_3$ gas, $(C_5H_5)HW(CO)_3$ gas, $(C_7H_8)W(CO)_3$ gas, and (1,5-COD)W(CO)$_4$ gas.

The first tungsten nucleation layer is deposited by repeating a deposition cycle comprising a supply of reaction gas for 0.2~5 seconds, a purge for 0.5~10 seconds, a supply of source gas for 1~10 seconds, and a purge for 0.5~10 seconds until the desired thickness is obtained.

The second tungsten nucleation layer is deposited through an ALD process that uses a gas selected from the group consisting of $B_2H_6$ gas, $BH_3$ gas, $B_{10}H_{14}$ gas, and $B(CH_3)_3$ gas as the reaction gas and gas containing W as the source gas.

The $B_2H_6$ gas, $BH_3$ gas, $B_{10}H_{14}$ gas or $B(CH_3)_3$ gas is used in its gaseous state or by forming plasma.

The gas containing W is one selected from the group consisting of $WF_6$ gas, $WCl_6$ gas, $WBr_6$ gas, $W(Co)_6$ gas, $W(C_2H_6)_6$ gas, $W(PF_3)_6$ gas, $W(allyl)_4$ gas, $(C_2H_5)WH_2$ gas, $[CH_3(C_5H_4)]_2WH_2$ gas, $(C_2H_5)W(CO)_3(CH_3)$ gas, W(butadiene)$_3$ gas, W(methylvinyl-ketone)$_3$ gas, $(C_5H_5)HW(CO)_3$ gas, $(C_7H_8)W(CO)_3$ gas, and (1,5-COD)W(CO)$_4$ gas.

The second tungsten nucleation layer is deposited by repeating a deposition cycle comprising a supply of reaction gas for 0.2~5 seconds, a purge for 0.5~10 seconds, a supply of source gas for 1~10 seconds, and a purge for 0.5~10 seconds until the desired thickness is obtained.

The tungsten layer is deposited through a CVD process that uses gas containing W as the source gas and $H_2$ gas as the reaction gas.

The gas containing W is one selected from the group consisting of $WF_6$ gas, $WCl_6$ gas, $WBr_6$ gas, $W(Co)_6$ gas, $W(C_2H_6)_6$ gas, $W(PF_3)_6$ gas, $W(allyl)_4$ gas, $(C_2H_5)WH_2$ gas, $[CH_3(C_5H_4)]_2WH_2$ gas, $(C_2H_5)W(CO)_3(CH_3)$ gas, W(butadiene)$_3$ gas, W(methylvinyl-ketone)$_3$ gas, $(C_5H_5)HW(CO)_3$ gas, $(C_7H_8)W(CO)_3$ gas, and (1,5-COD)W(CO)$_4$ gas.

The tungsten layer is deposited to a thickness of 100~500 Å.

The tungsten layer is deposited at a temperature of 300~450° C.

DESCRIPTION OF SPECIFIC EMBODIMENT

In an embodiment of the present invention, a Ti layer and a tungsten nitride layer are deposited on the polysilicon layer, and thereafter a thin tungsten nucleation layer is deposited on the tungsten nitride layer through an ALD process, and further thereafter a tungsten layer is deposited on the tungsten nucleation layer through a CVD process.

This decreases the resistance of the tungsten polymetal gate, as the Ti layer serves as an ohmic layer between the polysilicon and the tungsten nitride forming very thin Ti-silicide on the polysilicon, and the tungsten nitride layer supplies nitrogen into Ti layer to transform upper portion of Ti layer into titanium nitride (TiN) or titanium silicon nitride (Ti—Si—N) that can suppress the interfacial between polysilicon and tungsten.

Figure 1:
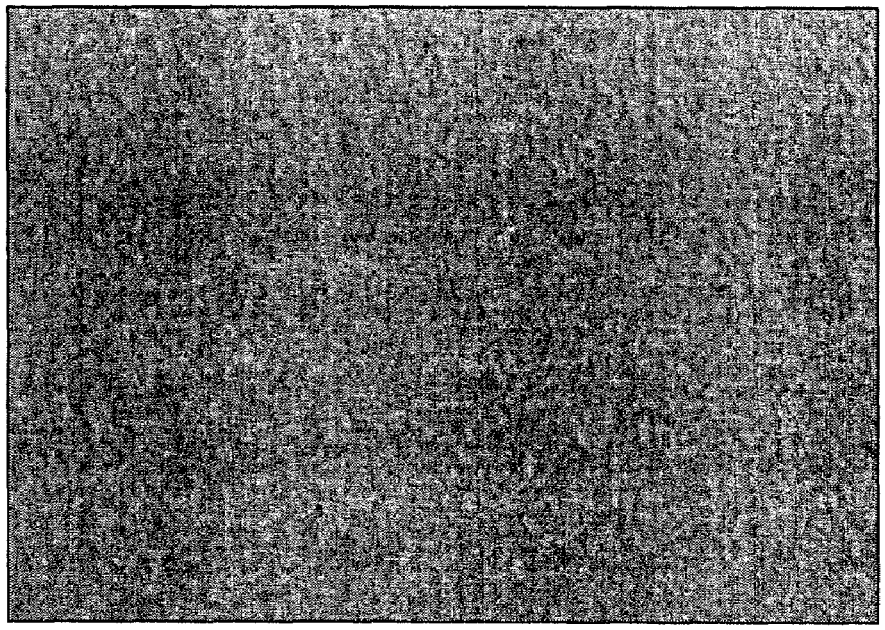
FIG. 1 is a photograph showing the grain size of the tungsten layer deposited according to the conventional art.
Figure 2:
FIG. 2 is a photograph showing the grain size of the tungsten layer deposited according to an embodiment of the present invention.

Further, according to an embodiment of the present invention, because the tungsten nucleation layer is deposited before the tungsten layer is formed, as can be readily seen from FIG. 2, a tungsten layer having a greater grain size than the conventional art can be obtained, and therefore, the resistance of the tungsten polymetal gate can be further decreased.

Hereafter, a method of forming a tungsten polymetal gate in accordance with an embodiment of the present invention will be described with reference to FIGS. 3A through 3G.

Figure 3A:
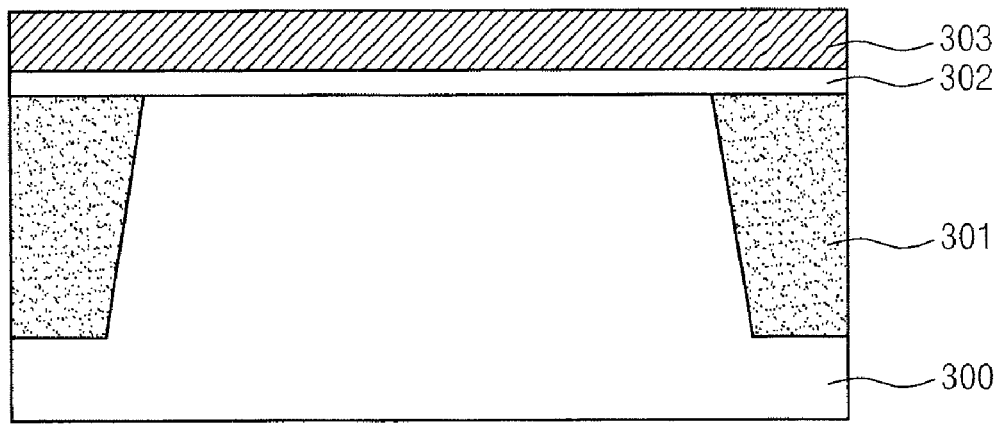
FIGS. 3A through 3G are cross-sectional views illustrating the formation of a tungsten polymetal gate in accordance with an embodiment of the present invention.

Referring to FIG. 3A, a gate insulation layer 302 and a polysilicon layer 303 are sequentially formed on a semiconductor substrate 300 having an isolation structure 301. The gate insulation layer 302 is formed as an oxide layer, and the polysilicon layer 303 is formed as a polysilicon layer doped with P-type or n-type impurities.

Figure 3B:
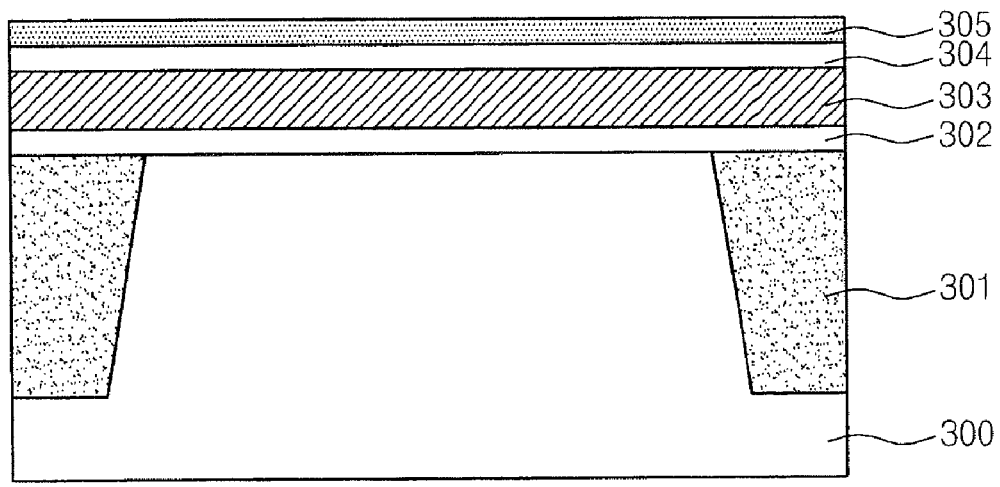

Referring to FIG. 3B, a Ti layer 304 is deposited on the polysilicon layer 303 through a plasma vapor deposition (PVD) process. The Ti layer 304 serves as an ohmic layer between polysilicon 303 and tungsten nitride forming very thin Ti-silicide on the polysilicon layer, and the subsequently deposited tungsten nitride layer 305 supplies nitrogen into Ti layer to transform upper portion of Ti layer into thin titanium nitride (TiN) or titanium silicon nitride (Ti—Si—N) that can suppress the interfacial diffusion between polysilicon and tungsten. The Ti layer 304 is deposited to a thickness of 20~150 Å. After the Ti layer 304 is deposited, a TiN layer can be additionally formed on the Ti layer. The TiN layer can also be deposited to a thickness of 20~150 Å.

A tungsten nitride layer 305 is deposited on the Ti layer 304 as a barrier layer for preventing diffusion. The tungsten nitride layer 305 is a barrier layer that is formed to prevent a tungsten silicide layer from forming in a subsequent annealing process and thereby causing volume expansion. The tungsten nitride layer 305 is deposited to a thickness of 20~150 Å through a PVD process.

Figure 3C:
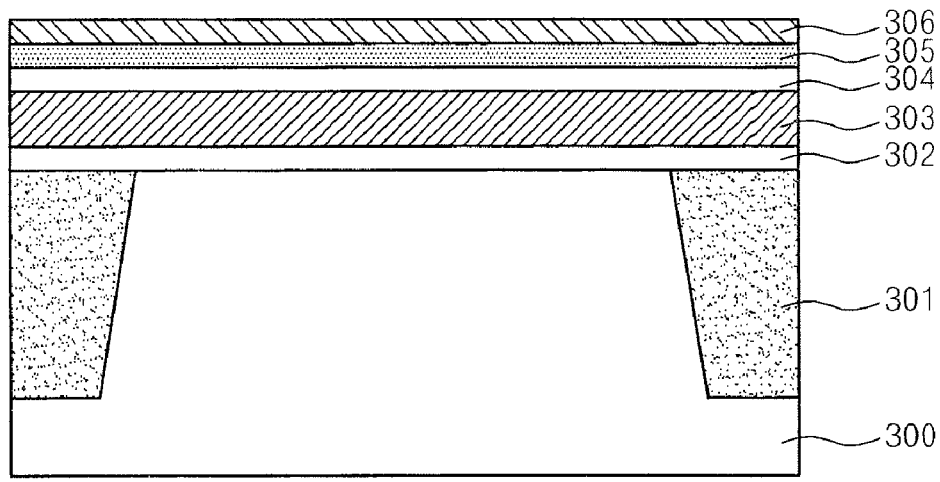

Referring to FIG. 3C, a first tungsten nucleation layer 306 is deposited on the tungsten nitride layer 305. The first tungsten nucleation layer 306 is deposited to a thickness of 10~100 Å through an ALD process at a temperature of 250~400° C. using $SiH_4$ gas or $Si_2H_6$ gas as the reaction gas and gas containing W as the source gas.

In more detail, the first tungsten nucleation layer 306 is deposited through the ALD process by repeating a deposition cycle comprising a supply of reaction gas for 0.2~5 seconds, a purge for 0.5~10 seconds, a supply of source gas for 1~10 seconds, and a purge for 0.5~10 seconds until the desired thickness is obtained.

Here, as the gas containing W, one selected from the group consisting of $WF_6$ gas, $WCl_6$ gas, $WBr_6$ gas, $W(Co)_6$ gas, $W(C_2H_6)_6$ gas, $W(PF_3)_6$ gas, $W(allyl)_4$ gas, $(C_2H_5)WH_2$ gas, $[CH_3(C_5H_4)]_2WH_2$ gas, $(C_2H_5)W(CO)_3(CH_3)$ gas, W(butadiene)$_3$ gas, W(methylvinyl-ketone)$_3$ gas, $(C_5H_5)HW(CO)_3$ gas, $(C_7H_8)W(CO)_3$ gas, and $(1,5\text{-}COD)W(CO)_4$ gas is used. The supply of reaction gas can be conducted by supplying $SiH_4$ gas or $Si_2H_6$ gas in its gaseous state or by supplying plasma formed using the $SiH_4$ gas or the $Si_2H_6$ gas.

The first tungsten nucleation layer 306 can be deposited by reversing the sequence of supplying the reaction gas and the source gas. That is to say, the first tungsten nucleation layer 306 can be deposited by repeating a deposition cycle comprising a supply of source gas, a purge, a supply of reaction gas, and a purge until the desired thickness is obtained.

Before depositing the first tungsten nucleation layer 306, $B_2H_6$ gas can be additionally supplied to the resultant substrate having the tungsten nitride layer 305 formed thereon to facilitate nucleation reaction. The supply of the $B_2H_6$ gas is supplied for 1~10 seconds. Also, $B_2H_6$ gas and $WF_6$ gas can be additionally supplied to the resultant substrate having the tungsten nitride layer 305 formed thereon to facilitate nucleation reaction. At this time, the supply of the $B_2H_6$ gas and the $WF_6$ gas is implemented in a manner such that $B_2H_6$ gas is supplied for 1~10 seconds, purged for 0.5~10 seconds, $WF_6$ gas is supplied for 1~10 seconds, and purged for 0.5~10 seconds, sequentially.

Figure 3D:
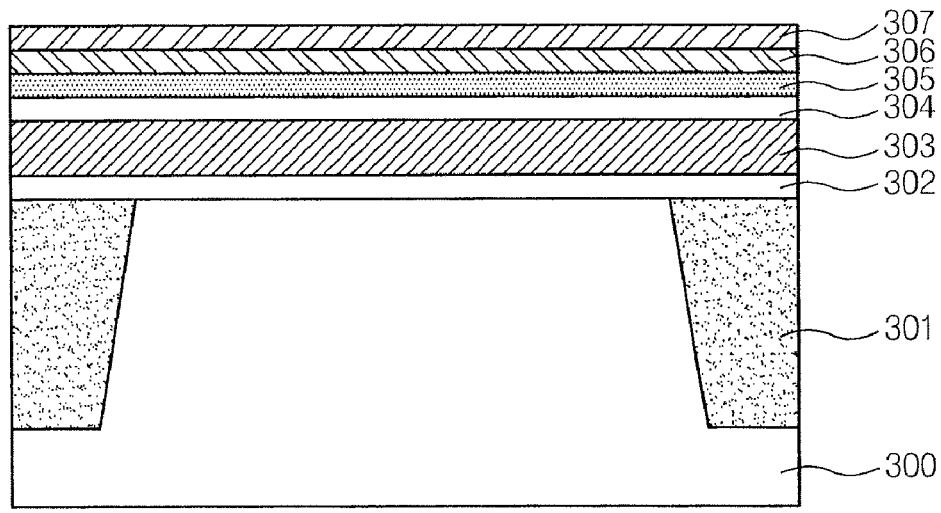

Referring to FIG. 3D, a second tungsten nucleation layer 307 is deposited on the first tungsten nucleation layer 306. The second tungsten nucleation layer 307 is deposited to the same thickness as the first tungsten nucleation layer 306 under the same process conditions as those adopted upon depositing the first tungsten nucleation layer 306. At this time, when depositing the second tungsten nucleation layer 307, one from the group of $B_2H_6$ gas, $BH_3$ gas, $B_{10}H_{14}$ gas, and $B(CH_3)_3$ gas is used as the reaction gas. The supply of reaction gas can be conducted by supplying the $B_2H_6$ gas, the $BH_3$ gas, the $B_{10}H_{14}$ gas or the $B(CH_3)_3$ gas in its gaseous state or by supplying plasma formed using the $B_2H_6$ gas, the $BH_3$ gas, the $B_{10}H_{14}$ gas or the $B(CH_3)_3$ gas.

Similar to the case of the first tungsten nucleation layer 306, the second tungsten nucleation layer 307 can be deposited by reversing the sequence of supplying the reaction gas and the source gas.

Figure 3E:
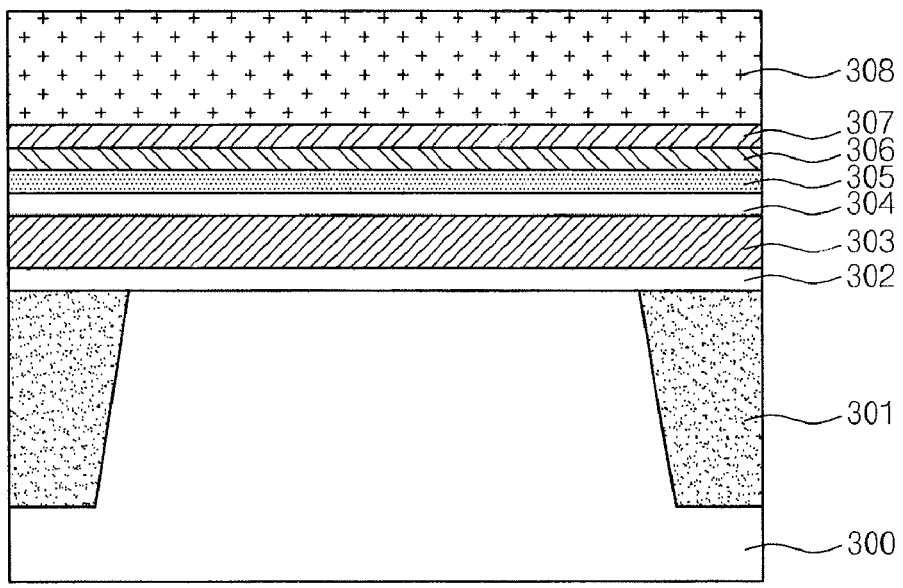

Referring to FIG. 3E, a tungsten layer 308 is deposited on the second tungsten nucleation layer 307 through a CVD process. The tungsten layer 308 is deposited to a thickness of 100~500 Å at a temperature of 300~450° C. through a CVD process using gas containing W as the source gas and $H_2$ gas as the reaction gas.

As the gas containing W, one selected from the group consisting of $WF_6$ gas, $WCl_6$ gas, $WBr_6$ gas, $W(Co)_6$ gas, $W(C_2H_6)_6$ gas, $W(PF_3)_6$ gas, $W(allyl)_4$ gas, $(C_2H_5)WH_2$ gas, $[CH_3(C_5H_4)]_2WH_2$ gas, $(C_2H_5)W(CO)_3(CH_3)$ gas, W(butadiene)$_3$ gas, W(methylvinyl-ketone)$_3$ gas, $(C_5H_5)HW(CO)_3$ gas, $(C_7H_8)W(CO)_3$ gas, and $(1,5\text{-}COD)W(CO)_4$ gas is used.

In the present invention, since the tungsten layer 308 is deposited on the first and second tungsten nucleation layers 306 and 307, it is possible to prevent the tungsten nitride layer 305 deposited on the Ti layer 304 from being crystallized when depositing the tungsten layer 308; therefore, it is possible to deposit the tungsten layer 308 such that it has a large grain size. As a consequence, in the present invention, because a tungsten layer 308 having a large grain size can be deposited, the specific resistance of the tungsten layer 308 is decreased, and the resistance of the tungsten polymetal gate is effectively decreased. Also, in the present invention, since the thickness of the gate can be decreased while maintaining resistance at the appropriate level, the parasitic capacitance caused in the gate is decreased, and the operational speed of the device is increased.

Figure 3F:
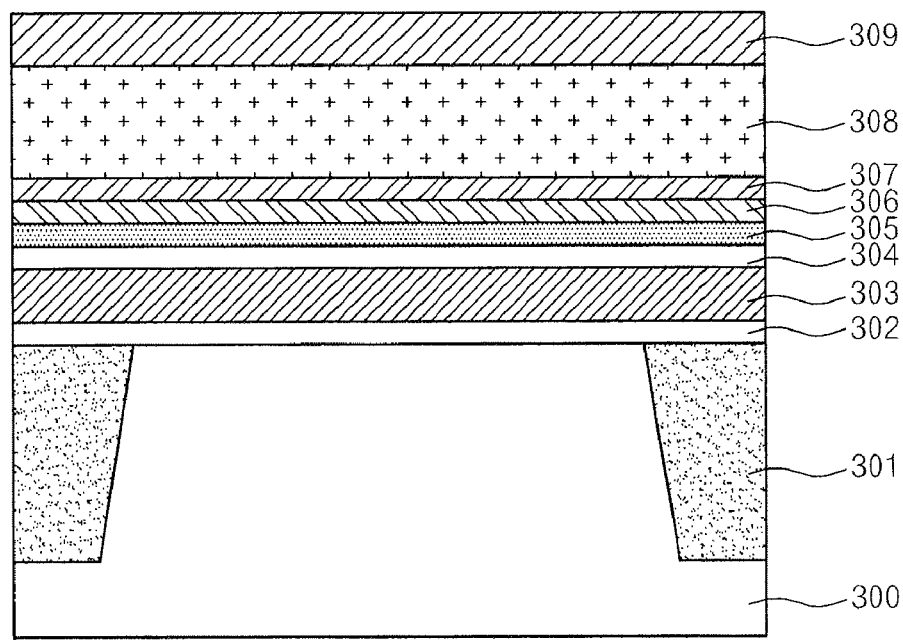

Referring to FIG. 3F, a hard mask layer 309 is deposited on the tungsten layer 308. As the hard mask layer 309, a nitride layer or an amorphous carbon layer is deposited.

Figure 3G:
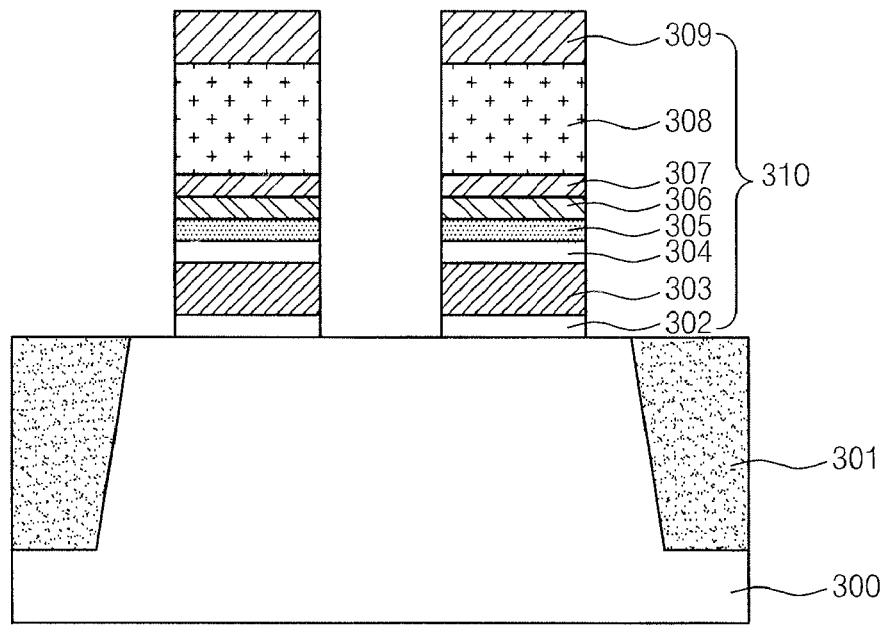

Referring to FIG. 3G, the hard mask layer 309 is etched through, for example, a photolithography process. Then, the tungsten layer 308, the first and second tungsten nucleation layers 306 and 307, the tungsten nitride layer 305, the Ti layer 304, the polysilicon layer 303, and the gate insulation layer 302 are etched using the etched hard mask layer 309 as an etch mask, and thereby, a tungsten polymetal gate 310 is formed.

Thereafter, while not shown in the drawings, a series of subsequent processes, including a selective oxidation process for removing etch damage and a cleaning process, are performed to form the tungsten polymetal gate 310 according to an embodiment of the present invention.

In an embodiment of the present invention, due to the fact that a tungsten layer is deposited on a thin tungsten nucleation layer when forming a tungsten polymetal gate, the specific resistance of the tungsten layer is decreased, and therefore, the resistance of the tungsten polymetal gate is effectively decreased.

Figure 4:
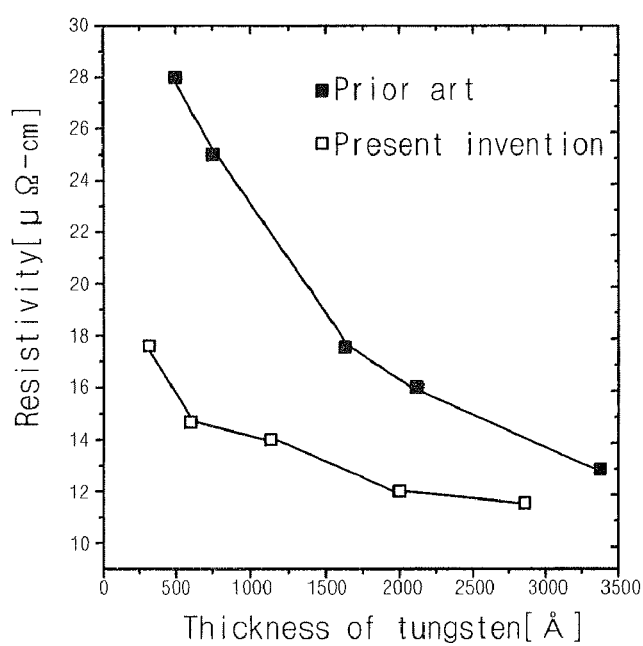
FIG. 4 is a graph illustrating advantageous effects caused due to an embodiment of the present invention.

In detail, referring to FIG. 4, when a tungsten layer having a thickness of 500 Å is deposited, the tungsten layer deposited according to the conventional art has a specific resistance of 28 μΩ-cm, whereas the tungsten layer deposited according to an embodiment of the present invention has a lower specific resistance of 18 μΩ-cm. Therefore, as demonstrated by an embodiment of the present invention that the specific resistance can be decreased by 46% when compared to the conventional art, the resistance of the polymetal gate is effectively improved by the present invention.

As is apparent from the above description, since a tungsten layer is deposited on a tungsten nucleation layer when forming a tungsten polymetal gate, the specific resistance of the tungsten layer is decreased according to an embodiment of the present invention. As a consequence, the resistance of the tungsten polymetal gate is effectively decreased according to an embodiment of the present invention.

Although a specific embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of forming a tungsten polymetal gate, comprising the steps of:
   sequentially forming a gate insulation layer and a polysilicon layer on a semiconductor substrate;
   depositing a barrier layer on the polysilicon layer;
   depositing a tungsten nucleation layer on the barrier layer through an atomic layer deposition (ALD) process;
   depositing a tungsten layer on the tungsten nucleation layer through a chemical vapor deposition (CVD) process;
   depositing a hard mask layer on the tungsten layer; and
   etching the hard mask layer, the tungsten layer, the tungsten nucleation layer, the barrier layer, the polysilicon layer, and the gate insulation layer,
   wherein the step of depositing a tungsten nucleation layer comprises the steps of:

forming a first tungsten nucleation layer on the barrier layer through an ALD process; and
forming a second tungsten nucleation layer on the first tungsten nucleation layer.

2. The method of claim 1, wherein the barrier layer comprises a stack of a Ti layer and a WN layer; or a stack of a Ti layer, a TIN layer, and a WN layer, wherein the tungsten nucleation layer is formed on the WN layer through the ALD process to prevent the WN layer from being crystallized when depositing the tungsten layer.

3. The method of claim 2, wherein each of the Ti layer, the WN layer, and the TiN layer has a thickness of 20~150 Å.

4. The method of claim 1 further comprising the step of:
supplying $B_2H_6$ gas for 1~10 seconds to the resultant substrate having the barrier layer formed thereon to facilitate nucleation reaction after the step of depositing a barrier layer but before the step of depositing a tungsten nucleation layer on the barrier layer.

5. The method of claim 1 further comprising the step of:
supplying $B_2H_6$ gas and $WF_6$ gas to the resultant substrate having the barrier layer formed thereon to facilitate nucleation reaction after the step of depositing a barrier layer but before the step of depositing a tungsten nucleation layer on the barrier layer.

6. The method of claim 1, wherein each of the first and second tungsten nucleation layers is formed to have a thickness of 10~100 Å.

7. The method of claim 1, wherein the first and second tungsten nucleation layers are formed at a temperature of 250~400° C.

8. The method of claim 1, wherein the first tungsten nucleation process is deposited through an ALD process, which uses $SiH_4$ gas or $Si_2H_6$ gas as the reaction gas and gas containing W as the source gas.

9. The method of claim 8, wherein the $SiH_4$ gas or $Si_2H_6$ gas in a gaseous state or plasma state is supplied during the step of forming a first tungsten nucleation.

10. The method of claim 8, wherein the gas containing W is one of: $WF_6$ gas, $WCl_6$ gas, $WBr_6$ gas, $W(Co)_6$ gas, $W(C_2H_6)_6$ gas, $W(PF_3)_6$ gas, $W(allyl)_4$ gas, $(C_2H_5)WH_2$ gas, $[CH_3(C_5H_4)]_2WH_2$ gas, $(C_2H_5)W(CO)_3(CH_3)$ gas, $W(butadiene)_3$ gas, $W(methylvinyl-ketone)_3$ gas, $(C_5H_5)HW(CO)_3$ gas, $(C_7H_8)W(CO)_3$ gas, and $(1,5\text{-}COD)W(CO)_4$ gas.

11. The method of claim 8, wherein the first tungsten nucleation layer is deposited by repeating a deposition cycle until a predetermined thickness is obtained, the deposition cycle comprising:
supplying a reaction gas for 0.2~5 seconds and then purging for 0.5~10 seconds; and
supplying a source gas for 1~10 seconds and then purging for 0.5~10 seconds.

12. The method of claim 1, wherein the second tungsten nucleation process is deposited through an ALD process using one of $B_2H_6$ gas, $BH_3$ gas, $B_{10}H_{14}$ gas, and $B(CH_3)_3$ gas as the reaction gas and a gas containing W as the source gas.

13. The method of claim 12, wherein the $B_2H_6$ gas, $BH_3$ gas, $B_{10}H_{14}$ gas or $B(CH_3)_3$ gas in a gaseous state or plasma state is supplied during the step of forming a second tungsten nucleation layer.

14. The method of claim 12, wherein the gas containing W is selected from one of $WF_6$ gas, $WCl_6$ gas, $WBr_6$ gas, $W(Co)_6$ gas, $W(C_2H_6)_6$ gas, $W(PF_3)_6$ gas, $W(allyl)_4$ gas, $(C_2H_5)WH_2$ gas, $[CH_3(C_5H_4)]_2WH_2$ gas, $(C_2H_5)W(CO)_3(CH_3)$ gas, $W(butadiene)_3$ gas, $W(methylvinyl-ketone)_3$ gas, $(C_5H_5)HW(CO)_3$ gas, $(C_7H_8)W(CO)_3$ gas, and $(1,5\text{-}COD)W(CO)_4$ gas.

15. The method of claim 12, wherein the second tungsten nucleation layer is deposited by repeating a deposition cycle until a predetermined thickness is obtained, the deposition cycle comprising:
supplying a reaction gas for 0.2~5 seconds and then purging for 0.5~10 seconds; and
supplying a source gas for 1~10 seconds and then purging for 0.5~10 seconds.

16. The method of claim 1, wherein the tungsten layer is deposited through a CVD process using a gas containing W as the source gas and $H_2$ gas as the reaction gas.

17. The method of claim 16, wherein the gas containing W is selected from one of $WF_6$ gas, $WCl_6$ gas, $WBr_6$ gas, $W(Co)_6$ gas, $W(C_2H_6)_6$ gas, $W(PF_3)_6$ gas, $W(allyl)_4$ gas, $(C_2H_5)WH_2$ gas, $[CH_3(C_5H_4)]_2WH_2$ gas, $(C_2H_5)W(CO)_3(CH_3)$ gas, $W(butadiene)_3$ gas, $W(methylvinyl-ketone)_3$ gas, $(C_5H_5)HW(CO)_3$ gas, $(C_7H_8)W(CO)_3$ gas, and $(1,5\text{-}COD)W(CO)_4$ gas.

18. The method of claim 1, wherein the tungsten layer is deposited to a thickness of 100~500 Å.

19. The method of claim 1, wherein the tungsten layer is deposited at a temperature of 300~450° C.

20. A method of forming a tungsten polymetal gate, comprising the steps of:
sequentially forming a gate insulation layer and a polysilicon layer on a semiconductor substrate;
depositing a barrier layer on the polysilicon layer;
depositing a tungsten nucleation layer on the barrier layer through an atomic layer deposition (ALD) process;
depositing a tungsten layer on the tungsten nucleation layer through a chemical vapor deposition (CVD) process;
depositing a hard mask layer on the tungsten layer; and
etching the hard mask layer, the tungsten layer, the tungsten nucleation layer, the barrier layer, the polysilicon layer, and the gate insulation layer
supplying $B_2H6$ gas and $WF_6$ gas to the resultant substrate having the barrier layer formed thereon to facilitate nucleation reaction after the step of depositing a barrier layer but before the step of depositing a tungsten nucleation layer on the barrier layer,
wherein the step of supplying B2H6 gas and $WF^6$ gas comprises the steps of:
supplying $B_2H^6$ gas for 1~10 seconds, and thereafter purging for 0.5~10 seconds; and
supplying $WF_6$ gas for 1~10 seconds, and thereafter purging for 0.5~10 seconds.

21. The method of claim 20, wherein the barrier layer comprises a stack that includes a Ti layer and a WN layer, and wherein the step of depositing a tungsten nucleation layer comprises the steps of:
forming a first tungsten nucleation layer on the WN layer of the barrier layer through an ALD process;
forming a second tungsten nucleation layer on the first tungsten nucleation layer.

* * * * *